United States Patent
Cho et al.

(10) Patent No.: US 7,576,383 B2
(45) Date of Patent: Aug. 18, 2009

(54) CAPACITOR HAVING TAPERED CYLINDRICAL STORAGE NODE AND METHOD FOR MANUFACTURING THE SAME

(75) Inventors: Ho Jin Cho, Kyoungki-do (KR); Cheol Hwan Park, Seoul (KR); Jae Soo Kim, Kyoungki-do (KR); Dong Kyun Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 6 days.

(21) Appl. No.: 11/779,093

(22) Filed: Jul. 17, 2007

(65) Prior Publication Data

US 2008/0157093 A1 Jul. 3, 2008

(30) Foreign Application Priority Data

Dec. 29, 2006 (KR) ................. 10-2006-0138476

(51) Int. Cl.
*H01L 27/108* (2006.01)
(52) U.S. Cl. .............. 257/308; 257/306; 257/309; 257/E27.094
(58) Field of Classification Search ............ 257/306, 257/308, 309, E27.094
See application file for complete search history.

(56) References Cited

U.S. PATENT DOCUMENTS

| 6,664,584 | B2 * | 12/2003 | Yang et al. | 257/310 |
| 7,300,841 | B2 * | 11/2007 | Park | 438/254 |
| 2006/0263971 | A1 * | 11/2006 | Lee et al. | 438/238 |

FOREIGN PATENT DOCUMENTS

KR  1020050066189  6/2005

\* cited by examiner

*Primary Examiner*—Victor A Mandala
(74) *Attorney, Agent, or Firm*—Ladas & Parry LLP

(57) ABSTRACT

A capacitor is made by forming a buffer oxide layer, an etching stop layer, and a mold insulation layer over a semiconductor substrate having a storage node contact plug. The mold insulation layer and the etching stop layer are etched to form a hole in an upper portion of the storage node contact plug. A tapering layer is deposited over the mold insulation layer including the hole. The tapering layer and the buffer oxide layer are etched back so that the tapering layer is remained only at the upper end portion of the etched hole. A metal storage node layer formed on the etched hole over the remaining tapering layer. The mold insulation layer and the remaining tapering layer are removed to form a cylindrical storage node having a tapered upper end. A dielectric layer and a plate node are formed over the storage node.

6 Claims, 6 Drawing Sheets

CAPACITOR HAVING TAPERED CYLINDRICAL STORAGE NODE AND METHOD FOR MANUFACTURING THE SAME

CROSS-REFERENCE TO RELATED APPLICATIONS

The present application claims priority to Korean patent application number 10-2006-0138476 filed on Dec. 29, 2006, which is incorporated herein by reference in its entirety.

BACKGROUND OF THE INVENTION

The present invention relates to a method for manufacturing capacitor of a semiconductor device, and more particularly to a capacitor having a tapered cylindrical storage node to prevent leaning of the cylindrical storage node and a method for manufacturing the same.

As the semiconductor memory devices such as DRAMs are highly integrated, the width of a capacitor, which serves as a storage for storing data in the memory device, is narrower. The capacitor is made of a dielectric layer interposed between a storage node and a plate node, and the capacitance is proportional to the surface area of the node and a dielectric constant of the dielectric layer and inversely proportional to a distance between the nodes, i.e. a thickness of the dielectric layer.

Accordingly, in order to obtain a capacitor of high capacity, it is required to use a dielectric layer having a large dielectric constant, and/or to enlarge the surface area of the node, and/or to reduce a distant between the nodes. However, limitations exist as to the extent the distant between the nodes, i.e. a thickness of the dielectric layer, can be reduced, and as such the studies were focused on finding ways of using a dielectric layer having a large dielectric constant or enlarging the surface area of the node to form a high capacity capacitor.

A typical method for enlarging the surface area of the node includes a method of forming a three dimensional storage node having a concave or cylindrical shape. The cylindrical shape storage node is considered more advantageous to realize a capacitor of high capacity than a concave type storage node, because it has larger node area.

However, although not shown and described in detail, a dip-out process for removing a mold insulation layer is carried out in order to form the cylindrical storage node and, during a drying procedure in the dip-out process, a storage node could lean to cause bridging of two adjacent storage nodes due to the surface tension of deionized water (DIW) and the increased height of the storage node.

Accordingly, as a way to ensure and prevent the leaning of the storage node and the bridging between the adjacent storage nodes, it was required to secure the cell-to-cell spacing of more than the desired distance and to reduce the height of the storage nodes.

However, since the spacing between cells is already narrow from the mask state due to the reduction of design rule to achieve high integration of semiconductor devices, it is difficult to ensure the adequate cell-to-cell spacing using a conventional etching process and a cylindrical storage node forming process, and thus it is impossible to prevent the leaning of the cylindrical storage node. Consequently, it is impossible to form stably a cylindrical capacitor when it is made in a conventional way as described above.

BRIEF SUMMARY OF THE INVENTION

Embodiments of the present invention are directed to a capacitor in which a leaning of a cylindrical storage node is prevented and a method for manufacturing the same.

Further, embodiments of the present invention are directed to a capacitor capable of realizing stably a cylindrical capacitor by preventing generation of a bridge between adjacent storage nodes due to the leaning of a cylindrical storage node and a method for manufacturing the same.

In one embodiment, a capacitor may comprise a semiconductor substrate provided with a storage node contact plug; a cylindrical storage node formed over the semiconductor substrate so as to be in contact with the storage node contact plug, an upper end portion thereof having a tapered shape; a dielectric layer formed over the cylindrical storage node; and a plate node formed over the dielectric layer.

The capacitor may further comprise a metal silicide layer formed at an interface between the storage node contact plug and the cylindrical storage node.

The metal silicide layer is preferably a $TiSi_x$ layer.

The storage node is a metal layer made of at least one of TiN, WN, TaN, Ru, and Pt.

The dielectric layer is one of a $ZrO_2$ layer, an $Al_2O_3$ layer, and a laminated layer of $Al_2O_3$ layer and $ZrO_2$ layer.

The plate node is a metal layer made of at least one TiN, WN, TaN, Ru and Pt.

In another embodiment, a method for manufacturing a capacitor may comprise forming a buffer oxide layer, an etching stop layer, and a mold insulation layer over a semiconductor substrate provided with a storage node contact plug; etching the mold insulation layer and the etching stop layer to form a first hole in an upper portion of the storage node contact plug; depositing a tapering layer over the mold insulation layer including the first hole, a thickness of the tapering layer at an upper end portion being thicker that that at a lower end portion; etching back the tapering layer and the buffer oxide layer so that a second hole for exposing the storage node contact plug is formed and the tapering layer is remained only at an upper end portion of the second hole; forming a metal layer for a storage node at a surface of the second hole including the remaining tapering layer; removing the mold insulation layer and the remaining tapering layer to form a cylindrical storage node, an upper end portion thereof having a tapered shape; and forming a dielectric layer and a plate node over the storage node.

The etching stop layer is a nitride layer.

The mold insulation layer is a single layer of PE-TEOS or a double layer of PSG layer and PE-TEOS layer.

The tapering layer is formed as an oxide layer of one of a PE-TEOS layer, a PE-USG layer, an $O_3$-USG layer, a LP-TEOS layer, a HTO layer, and a SiON layer.

The tapering layer is deposited according to a CVD or PECVD process to a thickness of 50 to 500 Å at an upper end portion of the first hole and to a thickness of 10 to 100 Å at the lower end portion of the first hole.

The tapering layer remaining at an upper end portion of the second hole has a thickness of 20 to 100 Å.

The method may further comprise forming a metal silicide layer, preferably a $TiSi_x$ layer, over the storage node contact plug, after etching back the tapering layer and the buffer oxide layer but before forming the metal layer for the storage node.

The storage node is formed as a metal layer made of at least one of TiN, WN, TaN, Ru, and Pt according to a CVD or ALD process.

The dielectric layer is formed as one of a $ZrO_2$ layer, an $Al_2O_3$ layer, and a laminated layer of $Al_2O_3$ layer and $ZrO_2$ layer, and the $Al_2O_3$ layer and the $ZrO_2$ layer are formed using $Zr[N(CH_3)]_2$, $Zr[N(CH_2CH_3)]_2$, or $Zr[N(CH_3)(CH_2CH_3)]_2$ as a source of Zr, using $Al(Ch_3)_3$ as a source of Al, and using $O_3$ or $H_2O$ as a source of O according to an ALD process at a temperature of 200 to 480° C.

The plate node is formed a metal layer made of at least one TiN, WN, TaN, Ru, and Pt. Preferably, the plate node is a TiN layer formed as a double layer according to the CVD and PVD processes or a double layer according to the ALD and PVD processes.

In the other embodiment, a method for manufacturing a capacitor may comprise forming a buffer oxide layer, an etching stop layer, and a mold insulation layer over a semiconductor substrate provided with a storage node contact plug; etching the mold insulation layer, the etching stop layer, and the buffer oxide layer to form a hole for exposing the storage node contact plug; depositing a tapering layer over the mold insulation layer including inside the hole, wherein the thickness of the tapering layer at an upper end portion is thicker that than the thickness of the tapering layer at a lower end portion; etching back the tapering layer to expose the storage node contact plug, wherein the tapering layer is remained only at an upper end portion of the hole; forming a metal layer for a storage node on the surface of the hole including the remaining tapering layer at an upper end portion of the hole; removing the mold insulation layer and the remaining tapering layer to form a cylindrical storage node, wherein an upper end portion of the cylindrical storage node has a tapered shape; and forming a dielectric layer and a plate node over the storage node.

The tapering layer is formed in a CVD or PECVD process.

The tapering layer is deposited to a thickness of 50 to 500 Å at an upper end portion of the hole and to a thickness of 10 to 100 Å at a lower end portion of the hole.

The tapering layer remaining at an upper end portion of the hole has a thickness of 20 to 100 Å.

DESCRIPTION OF SPECIFIC EMBODIMENTS

A preferred embodiment of the present invention is directed to a capacitor, in which an upper end portion of a cylindrical storage node is formed to have a tapered shape. By doing this, since a cell-to-cell spacing, that is a space between the cylindrical storage nodes is ensured, a leaning of the cylindrical storage node and the resultant generation of a bridge between adjacent storage nodes can be prevented.

Hereafter, an embodiment of the present invention will be described with reference to the attached drawings.

Figure 1:
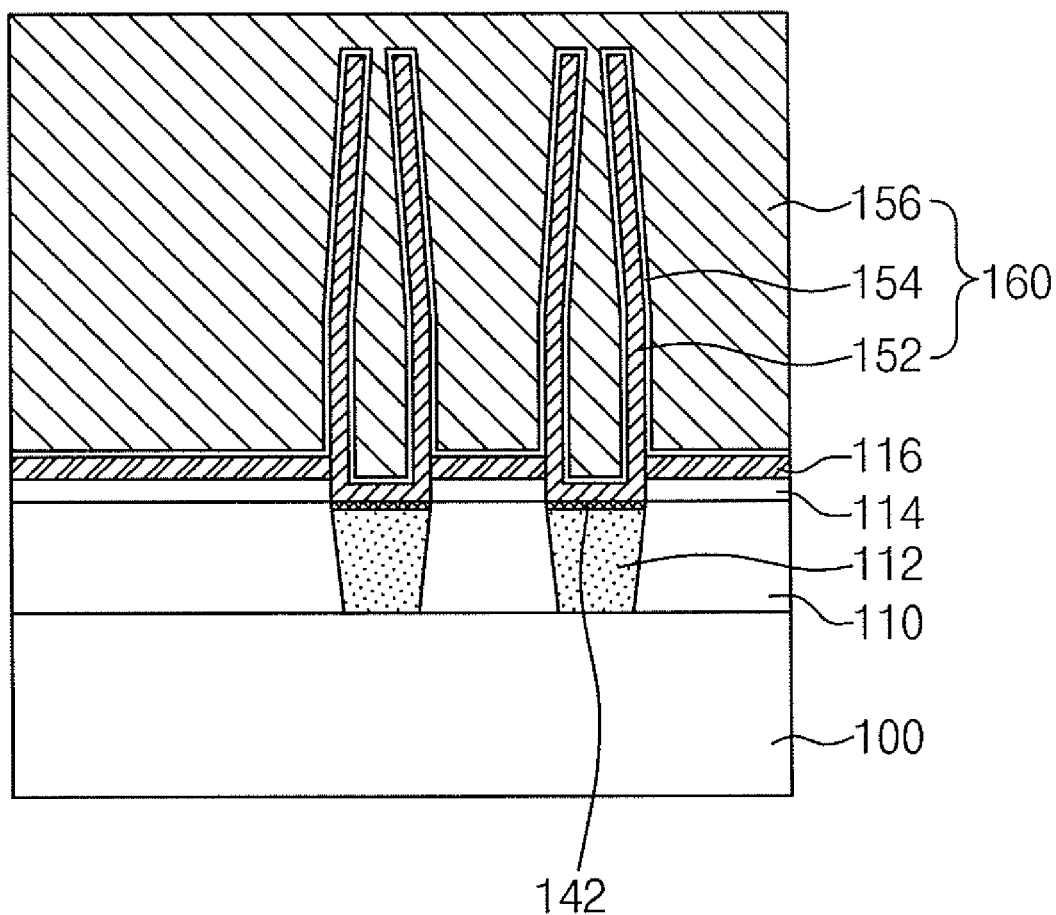
FIG. 1 is a cross-sectional view illustrating a capacitor in accordance with an embodiment of the present invention.

FIG. 1 is a cross-sectional view illustrating a capacitor in accordance with an embodiment of the present invention. As shown, the capacitor 160 in accordance with an embodiment of the present invention includes a storage node 152, a dielectric layer 154, and a plate node 156, and particularly the storage node 152 has a cylindrical structure in which its upper end portion is tapered.

In this case, in relation to the shape of the storage node 152 in which its upper end portion is tapered, the space between the adjacent cylindrical storage nodes is increased when compared to the conventional structure, and thus an adequate cell-to-cell spacing is ensured. Accordingly, in accordance with an embodiment of the present invention, a leaning of the cylindrical storage node as well as the resultant generation of a bridge between the adjacent storage nodes can be prevented through ensuring the adequate cell-to-cell spacing.

Therefore, in accordance with an embodiment of the present invention, the production yield can be increased since formation of cylindrical capacitors can be stably carried out, and a semiconductor memory device of high capacity can also realized through the formation of the cylindrical capacitor.

In FIG. 1, the reference numeral 110 indicates an interlayer insulation layer, 112 indicates a storage node contact plug, 114 indicates a buffer oxide layer, 116 indicates an etching stop layer, 142 indicates a $TiSi_x$ layer and H2 indicates a hole for the storage node.

FIGS. 2A through 2G are cross-sectional views illustrating the process steps of a method for manufacturing the capacitor in accordance with an embodiment of the present invention and the description to this is as follows.

Figure 2A:
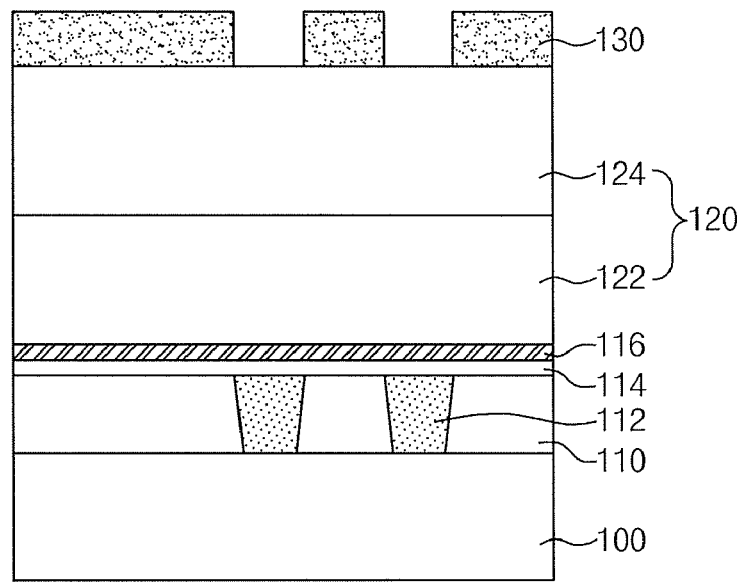
FIGS. 2A through 2G are cross-sectional views illustrating the process steps of a method for manufacturing the capacitor in accordance with an embodiment of the present invention.

Referring to FIG. 2A, after the interlayer insulation layer 110 is formed over an upper portion of the semiconductor substrate 100 formed with a base structure (not shown) including a transistor, the storage node contact plug 112 made of polysilicon is formed in a desired place in the interlayer insulation layer 110. Over the interlayer insulation layer 110 including the storage node contact plug 112, the buffer oxide layer 114, the etching stop layer 116, and a mold insulation layer 120 are sequentially formed.

The etching stop layer 116 is preferably formed of a nitride layer, and the mold insulation layer 120 is preferably formed of a double layer of a PSG layer 122 and a PE-TEOS layer 124. It may be possible to form the mold insulation layer 120 as a single layer of PE-TEOS.

An amorphous carbon layer is formed as a hard mask material over the mold insulation layer 120. After that, a hard mask 130 is formed by patterning the amorphous carbon layer through a photolithography process and etching process to expose a portion of the mold insulation layer 120 in a storage formation area, which corresponds to an upper area of the storage node contact plug 112.

Figure 2B:
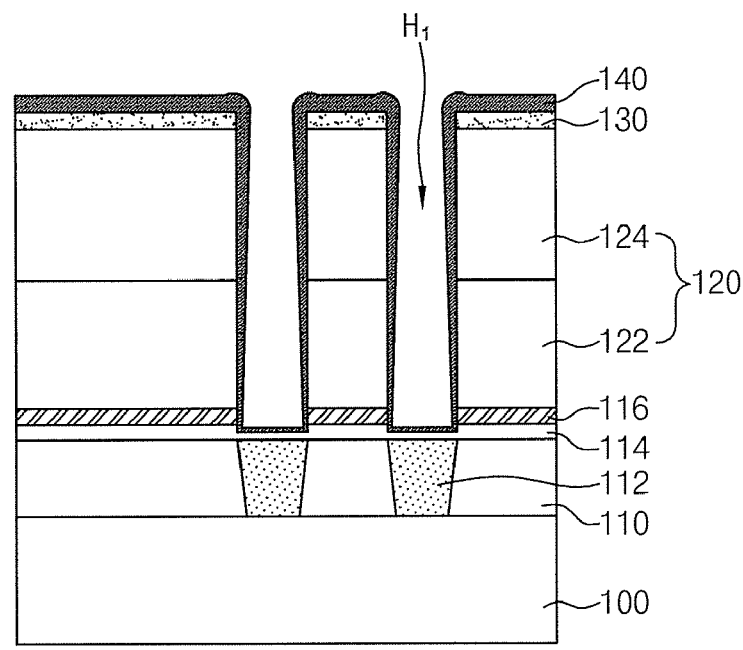

Referring to FIG. 2B, the mold insulation layer 120 and the etching stop layer 116 are etched using the hard mask 130 as an etching mask until the buffer oxide layer 114 is exposed, thereby forming a first hole $H_1$. At this time, most of the thickness of the hard mask 130 is removed, and thus only some thickness is remained. A tapering layer 140 is deposited over the hard mask 130 including the first hole $H_1$.

The tapering layer 140 is an element for causing the upper end portion of the cylindrical storage node to be formed to a tapered shape and is deposited with a non conformal deposition property that a deposition thickness at an upper end portion of the first hole $H_1$ is thicker than that at a lower end portion. For example, the tapering layer 140 is deposited with an oxide layer of one of PE-TEOS layer, PE-USG layer, $O_3$-USG layer, LP-TEOS layer, HTO layer, and SiON layer according to a CVD or PECVD process and is deposited to a thickness of approximately 50 to 500 Å at the upper end portion of the first hole $H_1$ and a thickness of approximately 10 to 100 Å at the lower end portion of the first hole $H_1$.

Figure 2C:
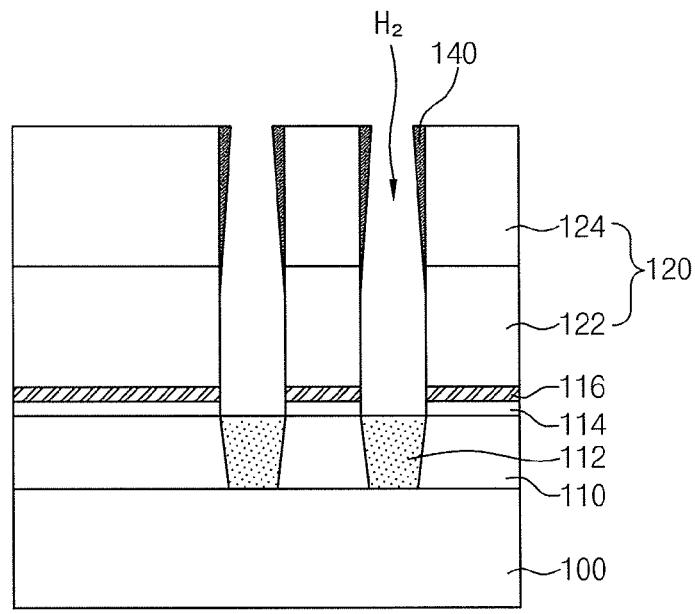

Referring to FIG. 2C, by etching the tapering layer 140 and the buffer oxide layer 114 through an etch back process, a portion of the tapering layer 140 formed over the mold insulation layer 120 and the remaining hard mask 130 below the portion of the tapering layer 140 are removed, and at the same time a second hole $H_2$ for exposing the storage node contact plug 112 is formed. At this time, the tapering layer 140 remains at or near the upper end portion of the second hole $H_2$, and the thickness of the remaining tapering layer 140 is preferably approximately 20 to 100 Å.

Figure 2D:
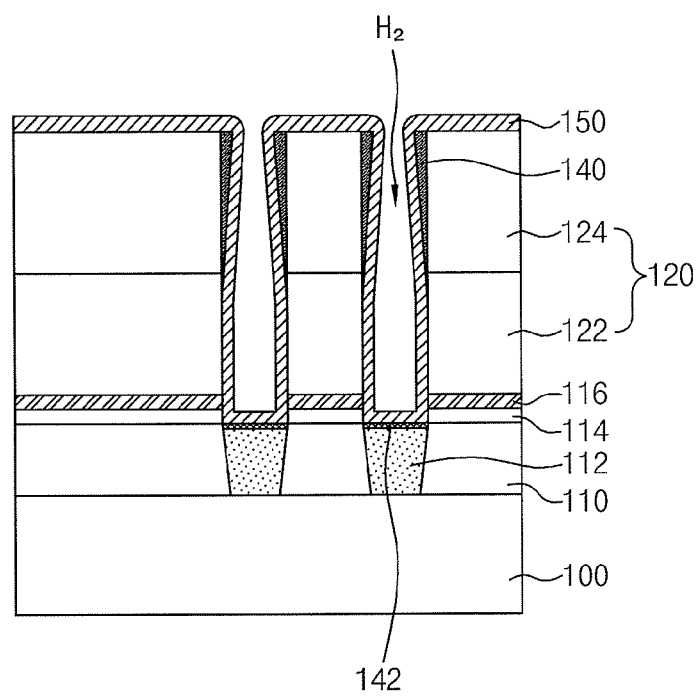

Referring to FIG. 2D, in order to decrease the contact resistance between the storage node contact plug 112 made of polysilicon and a metal storage node to be formed subsequently, a metal silicide layer 142, for example a $TiSi_x$ layer, is formed at the interface therebetween. The $TiSi_x$ layer is formed by depositing a Ti layer over the second hole $H_2$ including the remaining tapering layer 140 and the mold insulation layer 120 and then by carrying out a rapid heat treatment. Over the second hole $H_2$ including the silicide layer 142 and the mold insulation layer 120, a metal layer 150 for storage node is formed. The metal layer 150 for storage node is formed of one or more of TiN, WN, TaN, Ru, and Pt according to a CVD or ALD process. Preferably, the metal layer 150 for storage node is formed of TiN.

Figure 2E:
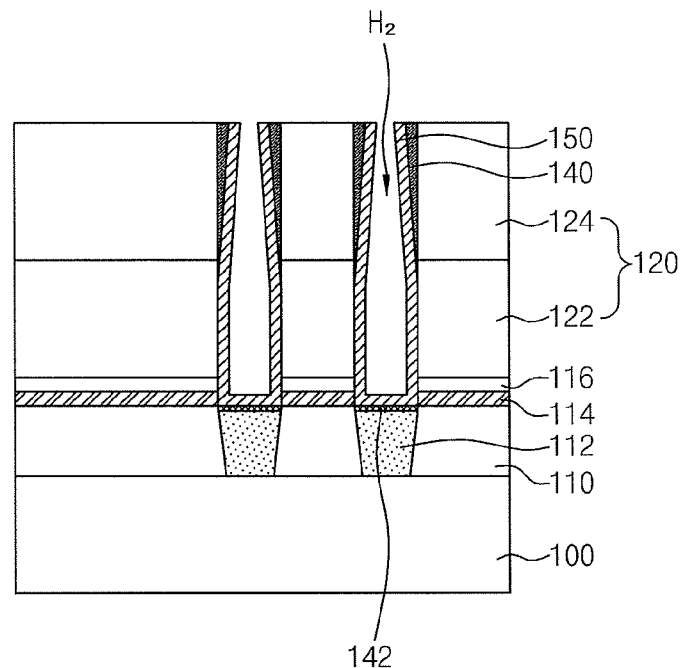

Referring to FIG. 2E, a portion of the metal layer 150 for storage node formed over the mold insulation layer 120 is removed according to a known process so that the adjacent storage nodes are separated from each other.

Figure 2F:
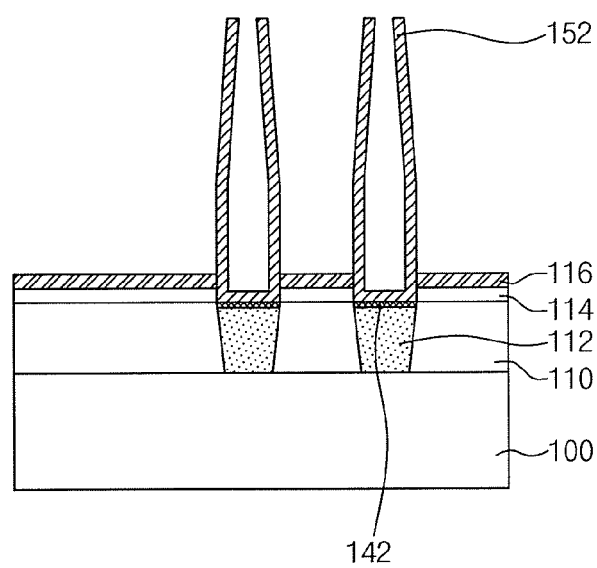

Referring to FIG. 2F, the mold insulation layer 120 is removed through a dip-out process to form the cylindrical storage node 152. When the mold insulation layer is removed, the remained tapering layer 140 is also removed through a cleaning process in the dip-out process.

Herein, since the cylindrical storage node 152 of the present invention has a shape that its upper end portion is slightly bent inward by the tapering layer 140 (as shown removed in FIG. 2F), the space between the adjacent cylindrical storage nodes 152, i.e. the cell-to-cell spacing, is increased. Therefore, the cylindrical storage node 152 is restricted from leaning during a dip-out process of the mold insulation layer 120, and thus the bridging between the adjacent cylindrical storage nodes 152 is prevented.

Therefore, the production yield is increased as the present invention provides stable and reliable ways of forming cylindrical capacitors, and further as the cylindrical storage nodes formed according to the present invention have a larger aspect ratio than the conventional products, the present invention provides superior ways to realize high capacity semiconductor memory devices.

Figure 2G:
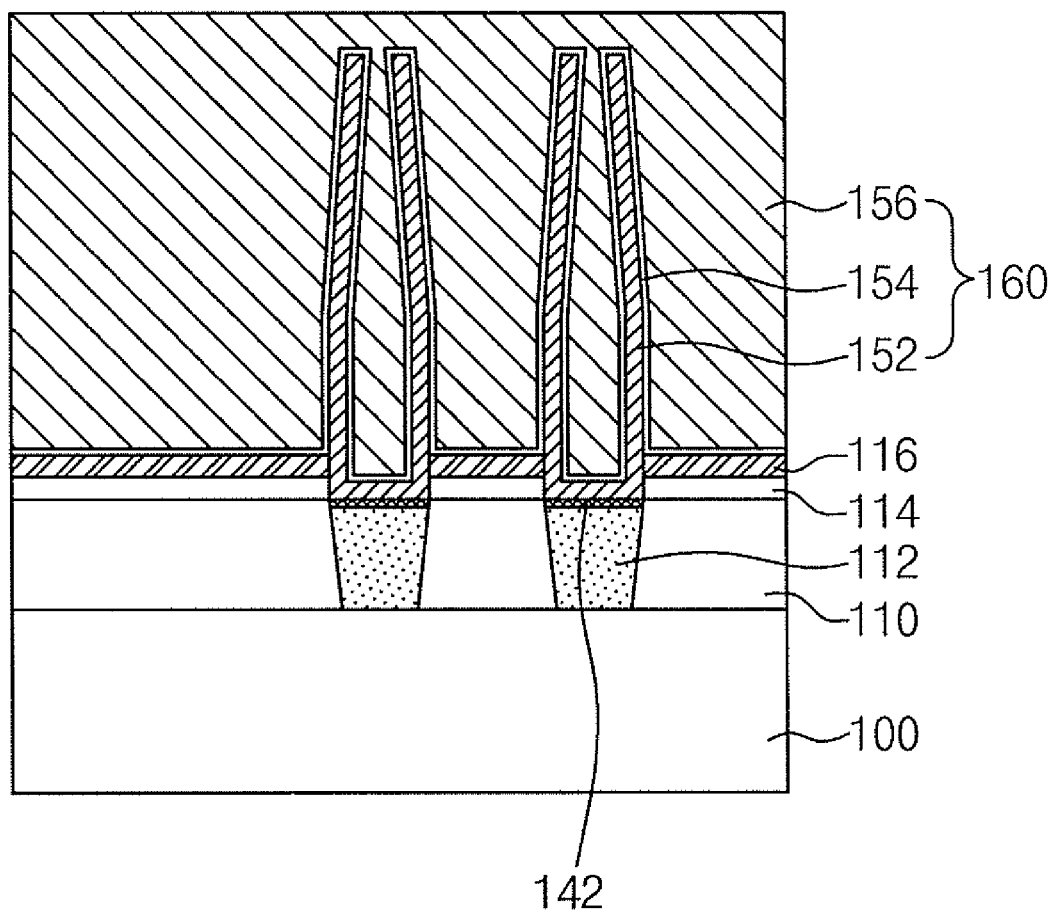

Referring to FIG. 2G, the dielectric layer 154 and the plate node 156 are sequentially formed over the etching stop layer 116 including the cylindrical storage node 152, thereby completing formation of a cylindrical capacitor 160 in accordance with an embodiment of the present invention. The dielectric layer 154 is formed of a $ZrO_2$ layer, and the thickness thereof is approximately 30 to 150 Å. It may be possible to form the dielectric layer 154 as an $Al_2O_3$ layer or a double layer of $Al_2O_3$ layer and $ZrO_2$ layer. The $ZrO_2$ layer and $Al_2O_3$ layer are formed using $Zr[N(CH_3)]_2$, $Zr[N(CH_2CH_3)]_2$, or $Zr[N(CH_3)(CH_2CH_3)]_2$ as a source of Zr, and using $Al(CH_3)_3$ as a source of Al, and using $O_3$ or $H_2O$ as a source of O according to an ALD process at a temperature of 200 to 480° C. The plate node 156 is a metal layer made of one or more of TiN, WN, TaN, Ru, and Pt. Preferably, the plate node 156 is formed of the TiN layer, and the TiN layer is formed as a double layer according to the CVD and PVD processes or a double layer according to the ALD and PVD processes.

As is apparent from the above description, in an embodiment of the present invention, since the cylindrical storage node 152 is formed using the tapering layer 140 to a shape in which its upper end portion of the cylindrical storage node 152 is inwardly tapered, the space between the adjacent storage nodes 152 is increased, thereby preventing the leaning of the cylindrical storage node and the bridging of two leaning adjacent storage nodes. Therefore, the production yield is increased due to reliable formation of the cylindrical capacitors.

Also, in an embodiment of the present invention, since the upper end portion of the cylindrical storage node is formed to an inwardly tapered shape, the cylindrical storage nodes having a larger aspect ratio larger than the conventional products can be formed, and thus the capacitance can be increased to realize a memory semiconductor device of high capacity.

Figure 3:
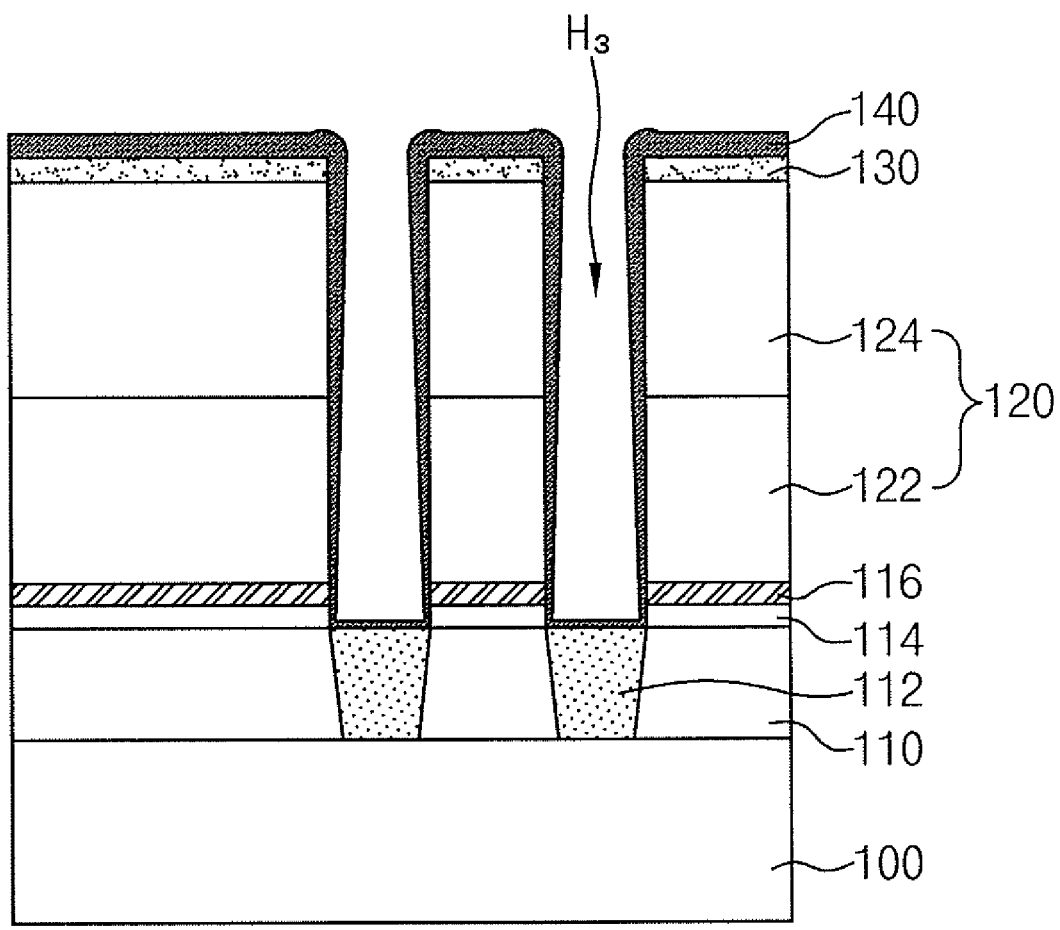
FIG. 3 is a cross-sectional view illustrating a capacitor in accordance with an another embodiment of the present invention.

FIG. 3 is a cross-sectional view illustrating a capacitor in accordance with another embodiment of the present invention. According to the this embodiment, a tapering layer 140 is performed after forming a third hole $H_3$ for exposing a storage node contact plug 112 by etching a mold insulation layer 120, etching stop layer 116 and a buffer oxide layer 114.

In that outside, the remaining manufacturing process is identical with a previously execution embodiment, the detailed description in order to omit.

Although the specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A capacitor, comprising:
   a semiconductor substrate provided with a storage node contact plug;
   a cylindrical storage node formed over the semiconductor substrate so as to be in contact with the storage node contact plug, an upper end portion of the cylindrical storage node having a tapered shape such that the upper end portion of the storage node is bent inward so as to increase cell-to-cell spacing;
   a dielectric layer formed over the cylindrical storage node; and
   a plate node formed over the dielectric layer.

2. The capacitor according to claim 1, further comprising a metal silicide layer formed at an interface between the storage node contact plug and the cylindrical storage node.

3. The capacitor according to claim 2, wherein the metal silicide layer is a $TiSi_x$ layer.

4. The capacitor according to claim 1, wherein the storage node is a metal layer made of at least one of TiN, WN, TaN, Ru, and Pt.

5. The capacitor according to claim 1, wherein the dielectric layer is one of a $ZrO_2$ layer, an $Al_2O_3$ layer, and a laminated layer of $Al_2O_3$ layer and $ZrO_2$ layer.

6. The capacitor according to claim 1, wherein the plate node is a metal layer made of at least one of TiN, WN, TaN, Ru, and Pt.

* * * * *